United States Patent [19]
Statovici

[11] Patent Number: 5,825,787
[45] Date of Patent: Oct. 20, 1998

[54] SYSTEM AND METHOD FOR ACCESSING A TEST VECTOR MEMORY

[75] Inventor: Mihai G. Statovici, San Jose, Calif.

[73] Assignee: Xilinx, Inc., San Jose, Calif.

[21] Appl. No.: 978,163

[22] Filed: Nov. 25, 1997

[51] Int. Cl.⁶ .................................................. G06F 11/00
[52] U.S. Cl. ................................................................ 371/27.1
[58] Field of Search .................................. 371/27.1, 22.1, 371/22.4, 22.5, 24, 25.1, 27.5, 27.7; 364/578

[56] References Cited

U.S. PATENT DOCUMENTS

| | | | |
|---|---|---|---|
| 4,100,532 | 7/1978 | Farnbach | 340/146.3 |
| 4,339,819 | 7/1982 | Jacobson | 371/16 |
| 4,433,414 | 2/1984 | Carey | 371/27 |
| 4,450,560 | 5/1984 | Conner | 371/25 |
| 4,493,045 | 1/1985 | Hughes, Jr. | 364/580 |
| 4,493,079 | 1/1985 | Hughes, Jr. | 371/27 |
| 4,500,993 | 2/1985 | Jacobson | 371/16 |
| 4,555,663 | 11/1985 | Shimizu | 324/73 |
| 4,635,256 | 1/1987 | Herlein | 371/1 |
| 4,639,919 | 1/1987 | Chang et al. | 371/27 |
| 4,652,814 | 3/1987 | Groves et al. | 324/73 |
| 4,860,291 | 8/1989 | Damm et al. | 371/27 |
| 5,001,418 | 3/1991 | Posse et al. | 324/73.1 |
| 5,321,701 | 6/1994 | Raymond et al. | 371/27 |
| 5,402,427 | 3/1995 | Parker | 371/27 |
| 5,423,050 | 6/1995 | Taylor et al. | 395/575 |
| 5,499,248 | 3/1996 | Behrens et al. | 371/22.1 |
| 5,506,499 | 4/1996 | Puar | 324/158.1 |
| 5,574,692 | 11/1996 | Dierke | 365/201 |
| 5,654,971 | 8/1997 | Heitele et al. | 371/24 |
| 5,657,486 | 8/1997 | Czamara et al. | 395/595 |
| 5,673,275 | 9/1997 | Garcia et al. | 371/22 |
| 5,748,642 | 5/1998 | Lesmeister | 371/22 |

*Primary Examiner*—Vincent P. Canney
*Attorney, Agent, or Firm*—Lois D. Cartier; Adam H. Tachner, Esq.

[57] ABSTRACT

An improved circuit tester allows for increased storage of test vectors in existing memory structures by noting where segments of test vectors repeat and storing such segments only once, then further utilizing memory space corresponding to otherwise unused test channels. Switching circuitry is included to selectively forward signals to and from a designated, multi-source conductor.

7 Claims, 7 Drawing Sheets

| PATTERN NAME | START | END | LENGTH |
|---|---|---|---|
| 10r_tbl.pat | 482624 | 483647 | 1024 |
| 10w_tbl.pat | 483648 | 484671 | 1024 |
| 10fpgmdiaga0.pat | 484672 | 491975 | 7304 |
| 10fpgmdiaga1.pat | 484672 | 491975 | 7304 |
| 10fpgmdiaga2.pat | 484672 | 491975 | 7304 |
| 10fpgmdiaga3.pat | 484672 | 491975 | 7304 |
| 10fpgmdiaga4.pat | 484672 | 491975 | 7304 |
| 10fpgmdiaga5.pat | 484672 | 491975 | 7304 |
| 10fpgmdiagu0.pat | 491976 | 499279 | 7304 |
| 10fpgmdiagu1.pat | 491976 | 499279 | 7304 |
| 10fpgmdiagu2.pat | 491976 | 499279 | 7304 |
| 10fpgmdiagu3.pat | 491976 | 499279 | 7304 |
| 10fpgmdiagu4.pat | 491976 | 499279 | 7304 |
| 10fpgmdiagu5.pat | 491976 | 499279 | 7304 |
| 10fpgmfulla0.pat | 499280 | 570735 | 71456 |
| 10fpgmfulla1.pat | 499280 | 570735 | 71456 |
| 10fpgmfulla2.pat | 499280 | 570735 | 71456 |
| 10fpgmfulla3.pat | 499280 | 570735 | 71456 |
| 10fpgmfulla4.pat | 499280 | 570735 | 71456 |
| 10fpgmfulla5.pat | 499280 | 570735 | 71456 |

The group of six 10fpgmdiaga*.pat entries is labeled 52.

SYSTEM AND METHOD FOR ACCESSING A TEST VECTOR MEMORY

FIELD OF THE INVENTION

The present invention is related generally to integrated circuit testers and more specifically to maximizing utilization of available space for test-vector storage.

BACKGROUND OF THE INVENTION

A circuit tester applies digital signal patterns, called test vectors, to the electrical connections, normally pins, of a device under test ("DUT"), taking the specifications of the DUT into account. As electronic circuit devices become more complex and the number of pins increases, circuit testers need more efficiently managed storage space to store the information required to perform adequate circuit tests. Also, because of the high cost of memory, there is a need to avoid increasing the memory capacity needed for carrying out a circuit test. Several attempts have been made in the art to address this need.

It is known to analyze a test vector memory matrix (test matrix) to find and reduce redundancy. The test matrix describes the test-data-sequences or test data being received from or supplied to each electrical connection of a DUT at each clock cycle. Each column of the test matrix describes the test signals being applied to one electrical connection of the DUT at different clock cycles. Each row of the test matrix describes the test signals at all electrical connections or pins of the DUT during one clock cycle. A row of the test matrix comprises a test vector. A test matrix may contain hundreds of thousands, even millions of vectors, and there may be several hundred tester pins in a tester participating in the circuit tests. Thus, the test vector memory requirements may be extremely large. To reduce the total memory size, when two or more identical test vectors exist within the matrix, such a test vector is stored only once in the memory of the circuit tester. All other test vectors that are not identical to other test vectors are also stored in the memory of the circuit tester, such as in one or more RAMs. Sequencing of this data is controlled by a single sequencer which provides to these RAMs the address of the data vector to be utilized at any given time.

It is also known to use a set of vector storage units each storing a segment of a test vector. When one test vector comprises two or more identical segments, this segment is stored only once. If, for example, the test data at two pins is the same at the same clock cycle, this segment of the test vector is stored only once.

Figure 1:
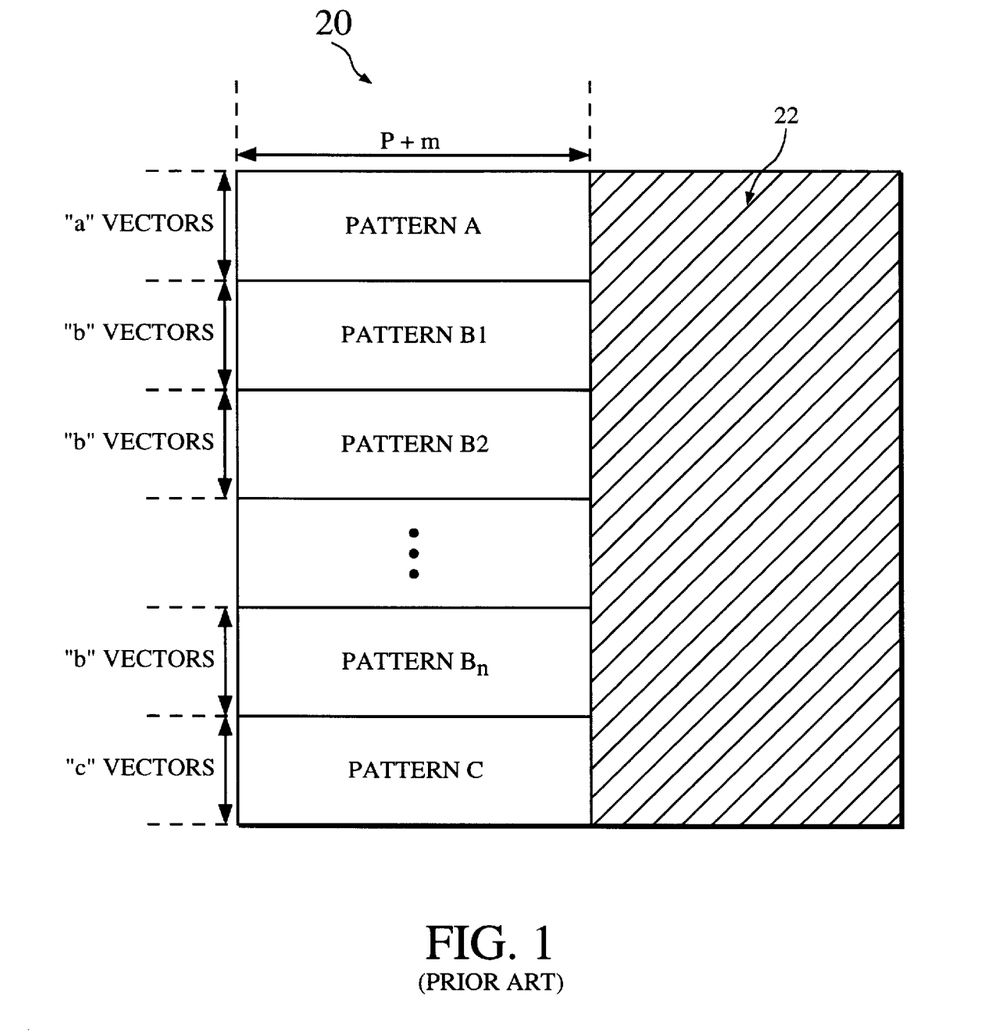
FIG. 1 illustrates a prior art test vector memory structure.

Referring to FIG. 1 for illustration, prior art test vector memory array 20 stores a plurality of test patterns A, B1, B2, . . . Bn and C. Each vector within the patterns is p+m bits wide (where there are "p" bits that are the same in at least two patterns, and "m" bits that differ between patterns), although the memory is even wider, being able to accommodate vectors having as many bits as there are channels in the tester load board (the tester board into which the DUT is loaded). Each pattern comprises a distinct plurality of vectors, but the differences between the patterns are often minimal, confined to the last m bits of each vector. For example, in a test pattern for a device having 224 pins, each pattern vector therefore having 224 bits, p=220 of the bits might be identical, with only the last m=4 bits changing from one pattern to the next. Thus, while patterns B1 through Bn in FIG. 1 each occupy separate storage spaces, their content is substantially redundant. Moreover, since vector space 22 goes unused (because the DUT has substantially fewer pins than there are data channels in the load board), it would be advantageous to devise a scheme that utilizes the unused space to reduce redundancy in test pattern storage, thereby allowing larger vector sequences to be stored without increasing memory size, and allowing storage of more than the a+b*n+c total vectors currently accommodated.

Figure 2:
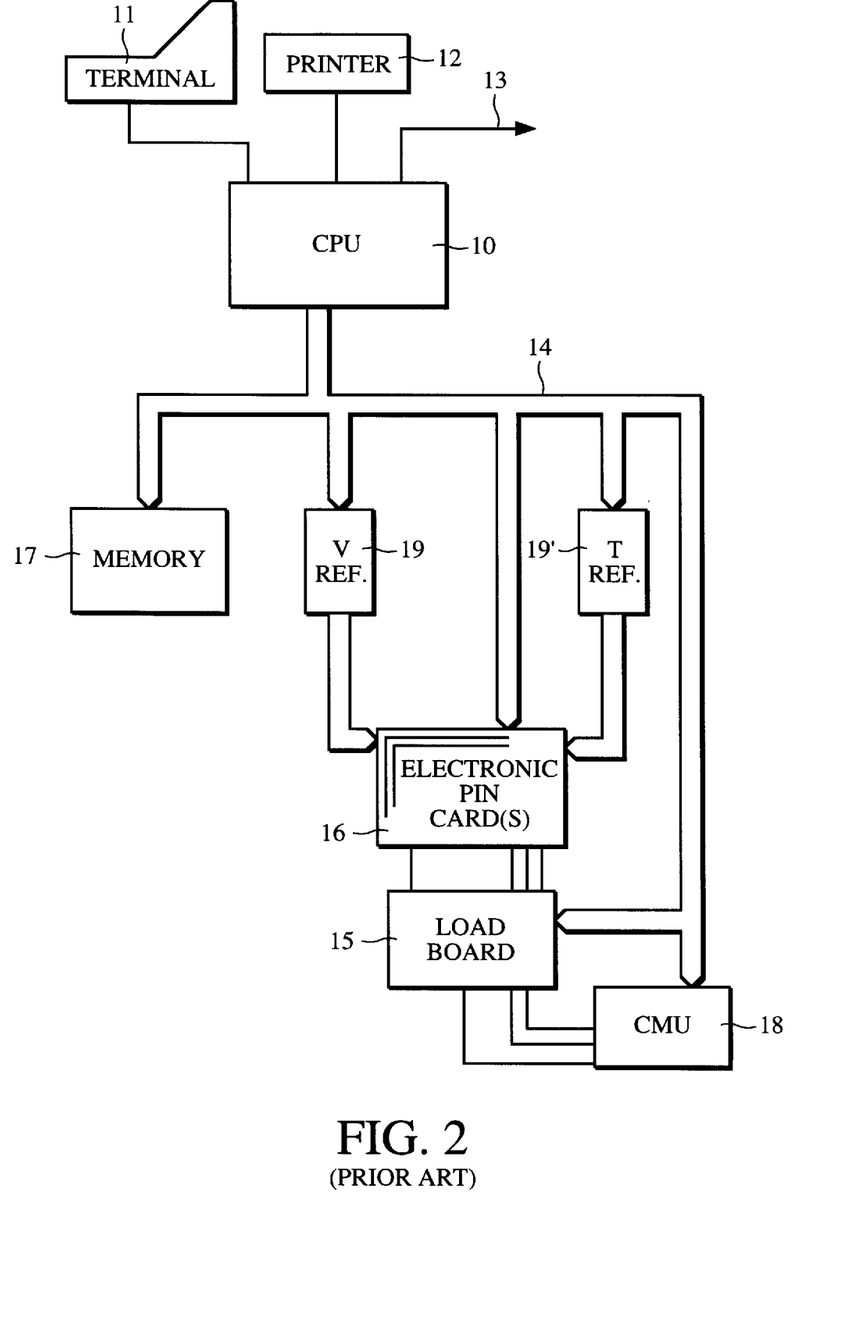
FIG. 2 is a functional block diagram of an available circuit tester.

Turning now from memory structures to tester circuitry, a schematic diagram of an available tester is provided in FIG. 2. Tester 1 comprises a central processing unit ("CPU") 10 connected to external elements such as terminal 11, printer 12, and port 13 for establishing a link with other apparatus such as a communication link with a host computer. CPU 10 is also connected to bus 14 for transmitting and receiving data to and from various tester elements.

The DUT is connected to the tester through a plug board (not shown) and load board 15, the input/output connections of which normally correspond to the number of pins of the device to be tested. Each of those connections is connected to a specific card referred to as electronic pin 16 (only one of which is shown in FIG. 2) which constitute in plurality a set of boards, arranged generally as a ring. Pins 16 comprise a bidirectional link with a test vector memory 17 and a specific link with a terminal of load board 15. Pins 16 also provide access to common circuits for providing reference voltages, 19, and time delays, 19', via bus 14. Each electronic pin 16 comprises amplitude and time shaping circuits for adjusting the signals received from memory 17 to the references provided by circuits 19 and 19'. Load board 15 is a printed circuit board including buffer impedances and switches for connecting the integrated circuit pins of the DUT either to an electronic pin 16 or to central measuring unit ("CMU") 18 which applies and measures currents and voltages.

While the tester of FIG. 2 might have total test vector storage space of a megabyte or more, for recently developed circuits having increasingly complex structures the number of test vectors required to adequately test the device can be so large as to exceed the memory space provided by most available testers.

Thus, there is a need to provide a tester architecture and memory that permits an increase in the number of test vectors implemented during a test cycle.

There is also a need to increase the number of test vectors without increasing the size of the tester memory by reducing the amount of information required to be loaded into the memory.

SUMMARY OF THE INVENTION

To address the shortcomings of the available art, an improved electronic circuit tester is provided that selectively forwards signals to and from a designated, multi-source conductor.

The circuit tester of the invention comprises: 1) a plurality of conductors providing an electrical connection to an electronic device to be tested; 2) a vector storage unit storing one or more vector signals; 3) a signal comparator means that applies an electrical signal to one of the conductors in response to a vector signal received from the vector storage unit, and receives an electrical signal on one of the conductors and compares it to a vector signal received from the vector storage unit; and 4) a plurality of signal lines selectively connecting the comparator means to one of the conductors.

In one embodiment, the circuit tester further comprises a switching memory access structure that selectively connects a plurality of signal lines to one conductor. The switching structure is implemented as a multiplexer in one embodiment.

The present invention also comprises a method of storing data in a test vector memory, the method comprising the steps of generating a test vector file comprising a plurality of test patterns, locating a plurality of test vectors having at least a predetermined number of bits in common, removing a common portion of the test vectors from one of the vectors, leaving a remaining portion, and storing the remaining portion in a vector space shared with at least one other of the plurality of test vectors.

BRIEF DESCRIPTION OF THE DRAWINGS

The aforementioned advantages of the present invention as well as additional advantages thereof will be more clearly understood hereinafter as a result of a detailed description of a preferred embodiment of the invention when taken in conjunction with the following drawings.

DETAILED DESCRIPTION OF A PREFERRED EMBODIMENT

The present invention provides substantially reduced data redundancy without compromising data integrity. The invention takes advantage of the available memory architecture, the width of which normally duplicates the width of the load board to which the DUT is attached for testing. Since the load board typically contains 256, 512 or 1024 channels, for example, and since devices typically have some number of pins less than the number of available channels, there are usually a plurality of unused channels, even if a plurality of devices are tested simultaneously. Thus, for example, a pair of 112-pin devices on a 256-pin load board provide 32 unused bits in every vector entry.

Figure 3:
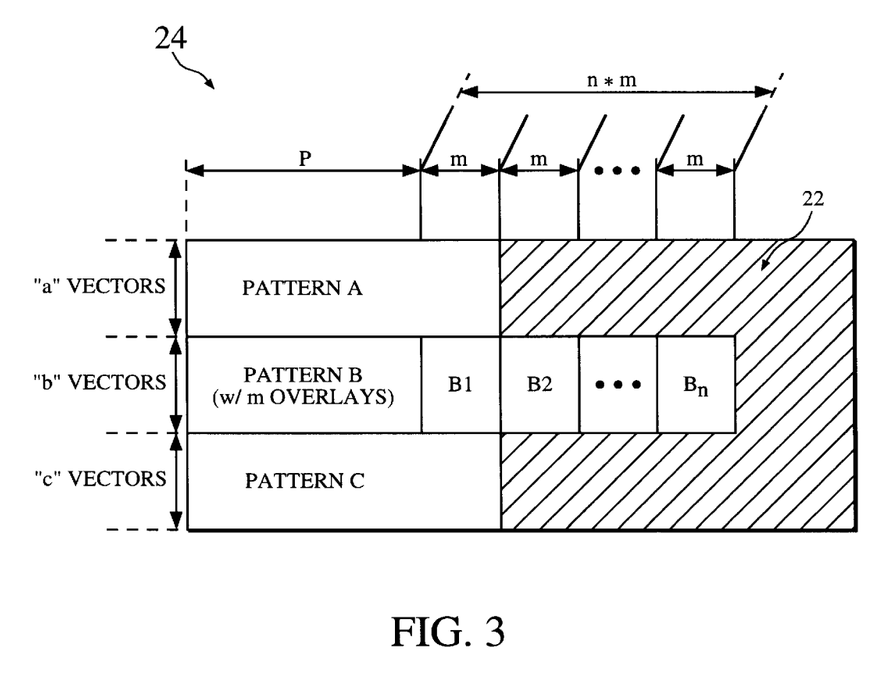
FIG. 3 illustrates a test vector memory structure created using a method of the present invention and compatible with the circuit tester of the present invention.

Referring to FIG. 3, a test vector memory structure 24 according to the present invention is illustrated. Redundant portions (comprising p bits) of patterns B1 through Bn are stored in a single vector memory space, and n−1 "overlay" sets of m distinct bits are stored in previously unused memory area 22. Using this modified storage structure, (n−1)*m bits of previously unused storage space are utilized, and b*(n−1) vector slots are preserved for additional vector and pattern storage, where b is the number of test vectors in each pattern B1 through Bn.

Figure 4:
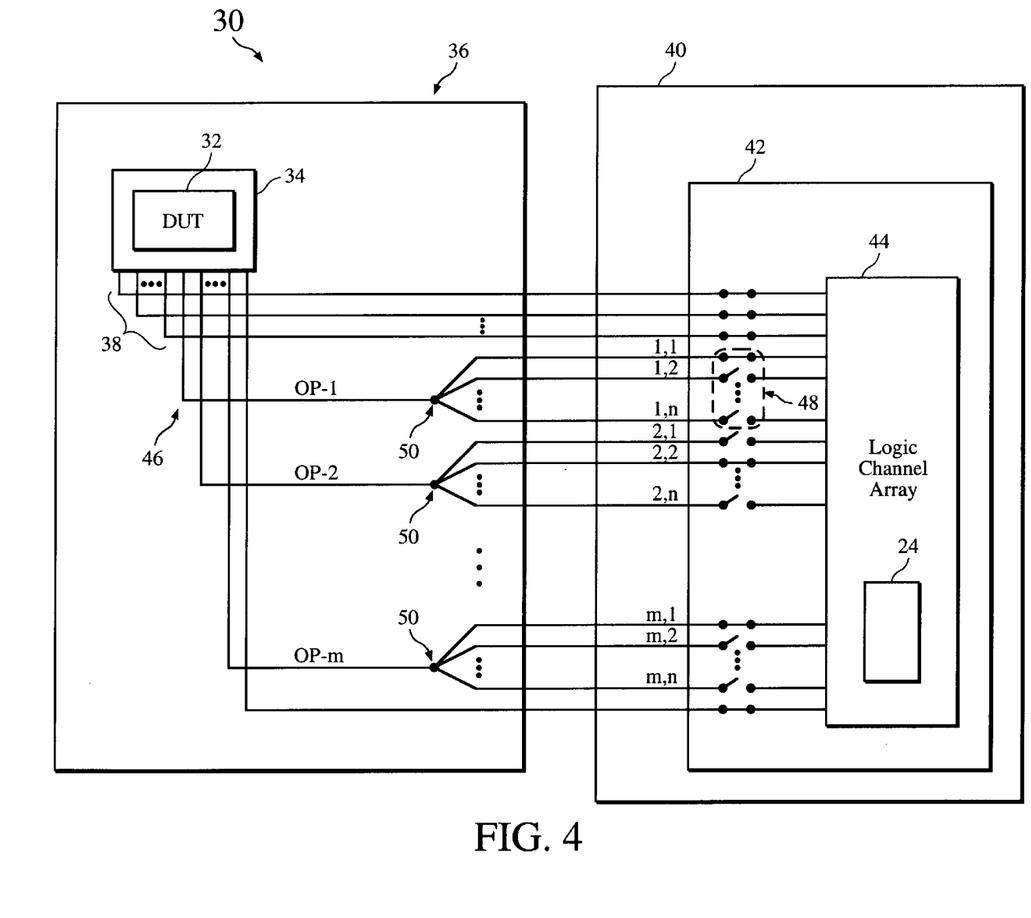
FIG. 4 illustrates an embodiment of the switching memory access structure of the present invention.

FIG. 4 illustrates a modified circuit 30 of the present invention that utilizes the test vector memory structure 24 of FIG. 3. Load board 36, including plug board 34, accommodates DUT 32. Pin leads 38 connect pins from DUT 32 to logic channel array 44 containing memory 24, as well as other resources such as drivers, receivers, and formatting circuitry.

To accommodate the modified and inventive structure of test vector memory structure 24, overlay pin lead sets OP-1 through OP-m, each including n leads, are soldered or otherwise placed into electrical communication with one another at points 50 on lead board 36. Thus, for example, any one of OP-1 leads (1,1) or (1,2) through (1,n) may be placed in electrical communication with pin lead 46 via corresponding test head switches 48, in a manner dictated by control logic within pin electronics control circuit 42. In an alternative embodiment, not shown, selection from among the various overlay pin leads can be accomplished through a multiplexer including the necessary control logic, as will be understood by one skilled in the art to which the present invention pertains. If the signals on the leads are multiplexed in logic channel array 44, no soldering points 50 are needed, thereby avoiding the addition of capacitive load and maximizing AC testing performance.

Figure 5:
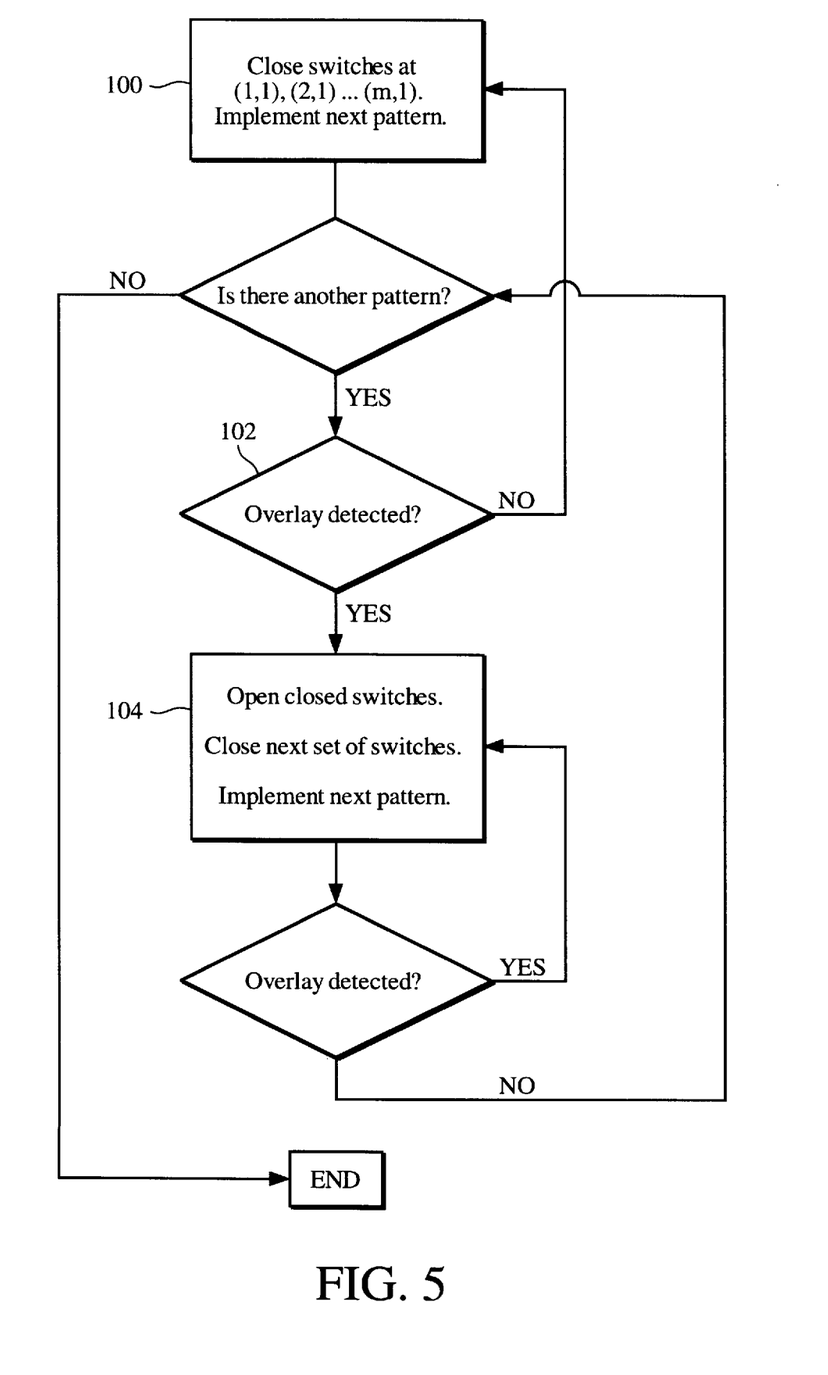
FIG. 5 is a flowchart illustrating the function of the present invention.

FIG. 5 provides a flowchart illustrating the test sequence for using test vector memory structure 24 within circuit 30 of the present invention. At step 100, pattern A is executed for "a" vectors, after switches on leads (1,1) and (2,1) through (m,1) are closed. At step 102, pattern B1 is executed for "b" vectors with the same switch configuration. Next, at step 104, to implement pattern B2, switches on leads (1,1) and (2,1) through (m,1) are opened and switches on leads (1,2) and (2,2) through (m,2) are closed. Pattern B2 is then implemented for "b" vectors from substantially the same memory space as B1. After step 104 is repeated for as many iterations as there are B-type overlay patterns, switches at leads (1,n−1) and (2,n−1) through (m,n−1) are opened and switches at leads (1,n) and (2,n) through (m,n) are closed again at step 100, and the final B-type pattern Bn is implemented. These switches are then opened and the system closes switches at leads (1,1) and (2,1) through (m,1), and pattern C is implemented for "c" vectors.

Figure 6:
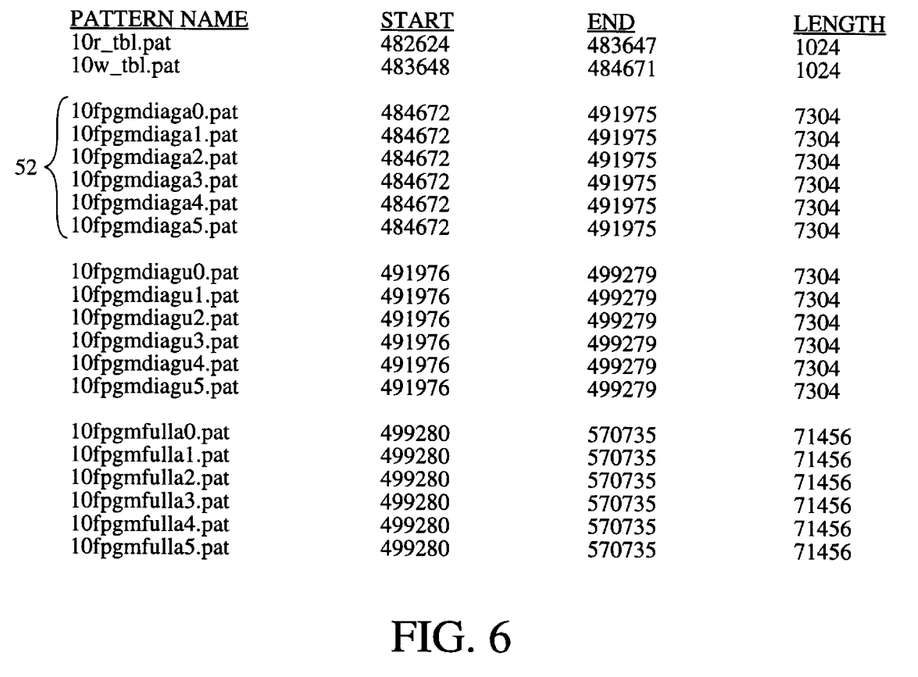
FIG. 6 is a pattern listing that illustrates the memory-saving feature of the present invention.

FIG. 6 illustrates the substantial reduction in memory requirements, as compared to the available systems, arising from use of the circuit of FIG. 4 to decode the improved memory structure of FIG. 3. FIG. 6 provides a partial exemplary listing of software files comprising test vector patterns. In this example, six leads are soldered or multiplexed at a plurality of load board leads, and thereby selectively connected to single DUT pins. Thus, illustrated pattern "10fpgmdiaga" has six iterations zero through 5 listed as six separate files 52. However, all six of these iterations are stored within the same memory location, namely from start address 484,672 to end address 491,975, thereby occupying a total length of 7,304 bytes. Without the method and system of the present invention, substantial additional space would be required to store each of the five other nearly identical patterns. Indeed, storage space savings of over sixty percent have been observed for available test vector file sets, including the set partially illustrated in FIG. 6.

Figure 7:
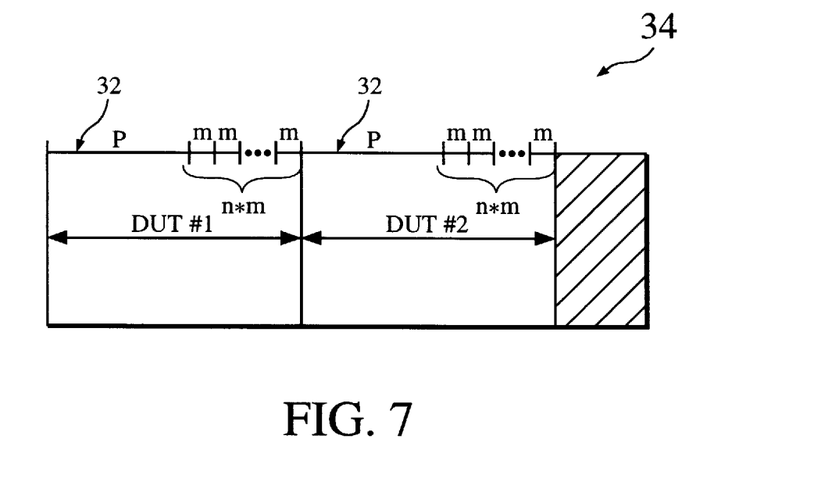
FIG. 7 illustrates a multi-device test vector memory structure according to one embodiment of the present invention.

FIG. 7 illustrates an alternative use of the method of the present invention, wherein a plurality of DUTs, each occupying only a small portion of the available data channels on load board 36, are simultaneously placed on the board and tested using the inventive memory structure and circuit described above. Each vector includes y(p+(n*m)) bits of data destined for the DUTs, wherein y is the number of DUTs placed on load board 36. If all of the plurality of DUTs are to receive the same test vectors, then these test vectors may be stored only once in test vector memory structure 24 (FIG. 3) for all the DUTs.

While the present invention has been described with reference to certain preferred embodiments, those skilled in the art will recognize that various modifications and other embodiments may be provided. For example, any switching scheme compatible with the envisioned circuitry could be used to chose the appropriate path for the overlay bits. These and other embodiments are intended to fall within the scope of the present invention and are provided for by the present invention which is limited only by the following claims.

What is claimed is:

1. An electronic circuit tester comprising:

a plurality of conductors for providing an electrical connection to an electronic device to be tested;

a vector storage unit storing one or more vector signals;

a signal comparator for applying an electrical signal to one of said conductors in response to a vector signal received from said vector storage unit and for receiving an electrical signal on one of said conductors and comparing it to a vector signal received from said vector storage unit; and a plurality of signal lines selectively connecting said comparator means to one of said conductors.

2. The circuit tester of claim 1 further comprising a switching memory access structure selectively connecting said plurality of signal lines to said one of said conductors.

3. The circuit tester of claim 2 wherein said switching structure comprises a multiplexer.

4. A method of storing data in a test vector memory, the method comprising the steps of:

generating a test vector file comprising a plurality of test patterns;

locating a plurality of test vectors having at least a predetermined number of bits in common;

removing a common portion of said test vectors from one of said vectors, leaving a remaining portion; and storing said remaining portion in a vector space shared with at least one other of said plurality of test vectors.

5. An apparatus for storing data in a test vector memory for an electronic circuit tester, comprising:

means for generating a test vector file comprising a plurality of test patterns;

means for locating a plurality of test vectors having at least a predetermined number of bits in common;

means for removing a common portion of said test vectors from one of said vectors, leaving a remaining portion; and means for storing said remaining portion in a vector space shared with at least one other of said plurality of test vectors.

6. An electronic testing apparatus for testing electronic circuits, comprising:

a plurality of leads for engaging conductors of an electronic circuit device under test;

means for sending individual test signal patterns to subsets of the plurality of leads; and means for storing selected test signal patterns, each having a common portion and a unique portion, by removing the common portion and storing the unique portion in a storage space shared with the unique portion of at least one other of the selected test signal patterns.

7. The electronic testing apparatus of claim 6, wherein the means for sending includes a switching means for first providing the common portion, and immediately thereafter providing the unique portion, of a selected test signal pattern to a group of leads.

* * * * *